Aug. 16, 1960 E. F. READ 2,949,533
AUTOMATIC GAIN CONTROL CIRCUIT FOR USE IN TRANSISTOR AMPLIFIERS
Filed April 17, 1959
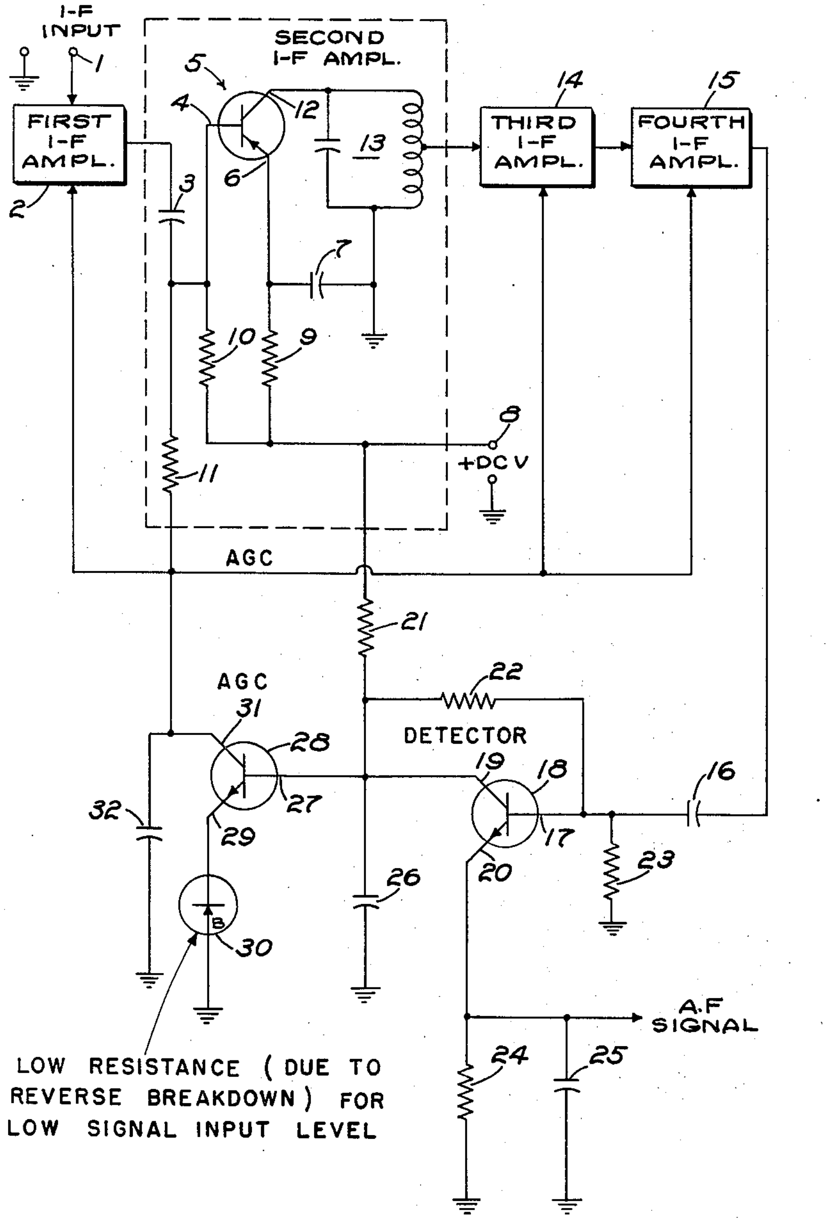
INVENTOR.
EMANUEL F. READ
BY Morris Moody
ATTORNEY
Glenn H. Antrim
AGENT United States Patent Office 2,949,533

Patented Aug. 16, 1960

2,949,533

AUTOMATIC GAIN CONTROL CIRCUIT FOR USE IN TRANSISTOR AMPLIFIERS

Emanuel F. Read, Marion, Iowa, assignor to Collins Radio Company, Cedar Rapids, Iowa, a corporation of Iowa Filed Apr. 17, 1959, Ser. No. 807,138

3 Claims. (Cl. 250—20)

This invention pertains to automatic-gain-control circuits of transistor amplifiers and particularly to gain control circuits having breakdown diodes and transistors in combination.

In certain applications of transistor amplifiers, the outputs of the amplifiers are to remain very nearly constant over wide ranges of signal input voltages. This flat, automatic-gain-control characteristic has not been obtained from transistor amplifiers in which the cascade stages are controlled by transistor circuits which do not include additional nonlinear control elements.

Accordingly this invention comprises, in combination with a transistor amplifier, a gain control stage that has a series circuit including the control elements of a transistor, a breakdown junction diode, and a resistor, detecting means responsive to the output of said transistor amplifier for controlling the current in said series circuit, said voltage breakdown junction diode rapidly changing its state of conduction in response to said output of said amplifier exceeding a predetermined level, and the output of said transistor being connected to the gain control circuits of said amplifier.

An object of this invention is to provide a gain control circuit which is responsive to signal level for maintaining constant the output of a transistor amplifier.

Features of the invention are its simple construction, reliability and its effectiveness in maintaining nearly constant output of controlled amplifier stages over wide levels of input signal.

The following description and the appended claims may be more readily understood with reference to the single accompanying drawing which shows a schematic diagram of a transistor amplifier incorporating the automatic-gain-control circuits of this invention.

Briefly, the accompanying drawing shows a four-stage transistor amplifier with the second stage being shown in detail and the remaining stages being shown in block form. The output of the fourth intermediate-frequency amplifier is connected to a detector. The output of the detector, which is proportional to the level of a carrier signal that is derived from the fourth I.-F. stage, is filtered and applied to a nonlinear control stage. This control stage includes a series resistor, the control elements of a transistor, and a breakdown junction diode. The output of the transistor is connected as a variable impedance element in a voltage divider network to which are connected the control elements of the four I.-F. stages. The breakdown junction diode has maximum conductivity for low signal input levels. For slightly higher input levels above a predetermined threshold the diode rapidly changes to a state of lower conductivity or higher resistance. This operation provides high gain of the amplifier and effective automatic volume control for low-level signals and also provides equally effective automatic volume control for high-level signals when the gain of the amplifier must be low.

Signal from I.-F. input circuits such as a conventional mixer is applied, with respect to ground, to input terminal 1 of the first I.-F. amplifier stage 2. I.-F. signal from the output of this first I.-F. amplifier stage is applied through coupling capacitor 3 to the base 4 of the type PNP transistor 5. The base-to-emitter circuit of transistor 5 is completed from emitter 6 through by-pass capacitor 7 to ground. In order to apply a positive voltage to the emitter, the emitter is also connected through resistor 9 to terminal 8 that is connected to a direct-current source. The positive terminal of the source of voltage is also connected to the voltage divider that comprises resistor 10, resistor 11 and automatic-gain-control circuits that vary the resistance of the divider in accordance with the level of the signal that is applied to the input of the amplifier. The junction of resistors 10 and 11 is connected to the base 4 so that the emitter-to-base bias voltage is equal to the difference in the voltages that are developed across resistors 9 and 10.

The collector 12 of the second I.-F. amplifier transistor 5 is connected through resonant circuit 13 to ground. Intermediate-frequency signal from circuit 13 is applied through the third and fourth I.-F. amplifiers 14 and 15 respectively and through coupling capacitor 16 to the base 17 of type NPN transistor 18. Although transistor 18 is referred to herein as a detector, in the application shown it may be considered to be a detector-amplifier wherein the detected output appears in the emitter circuit and the detected and amplified output appears in the collector circuit.

In order to obtain the required nonlinear operation for detection, transistor 18 is biased for low conductivity in the absence of a signal. The base 17 is connected to the junction of resistors 22 and 23 that are a part of a direct-current voltage divider which extends from terminal 8 through resistor 21, resistors 22 and 23 to ground. Resistor 21 also connects the positive terminal 8 to the collector 19 of detector transistor 18 and to the base 27 of automatic-gain-control, type NPN, transistor 28. The collector 19 and the base 27 are by-passed to ground through capacitor 26 which filters the output of transistor 18 so as to apply direct-current voltage to base 27. The emitter 20 of detector 18 is connected through load resistor 24 and also to an output circuit for applying audio-frequency signal to subsequent stages. Capacitor 25 that is connected across resistor 24 is a usual detector filter capacitor.

The emitter 29 of transistor 28 is connected through breakdown junction or zener diode 30 to ground. The control elements of transistor 28 and diode 30 are connected in series with resistor 21 between the source of voltage 8 and ground and control the flow of emitter current for the transistor. The collector circuit of the detector transistor 18 functions as a variable impedance across the series circuit that includes the input elements of transistor 28 and junction diode 30, so as to vary the control current of transistor 28. When the collector-to-base current flow of transistor 18 is low, that is when the impedance is relatively high, the emitter current through transistor 28 is high and the conductivity of diode 30 is maximum. The diode 30 is connected in that sense which permits emitter current of transistor 28 to flow in the reverse direction through the diode. When the voltage across the diode exceeds its breakdown potential, the resistance in the circuit from emitter to ground is low.

The collector 31 of control transistor 28 is connected to resistor 11 to complete the automatic-gain-control circuit of transistor 5. Filter capacitor 32 is connected between the emitter 31 and ground.

During operation of the circuit, the diode 30 is in its more conductive state when the input signal is less than some predetermined voltage which, in the circuit shown, may be about 8 microvolts. This low-level signal is applied through the I.-F. amplifier stages and is amplified nearly a maximum amount because the transistors in each of the amplifier stages have the proper bias between the emitter and the base for maximum amplification. The output of the fourth I.-F. amplifier 15 is applied to the base of detector transistor 18 and is rectified in the emitter-base circuit for developing an audio-frequency signal across resistor 24 for application to audio-frequency circuits.

The value of the voltage across resistor 21 is dependent upon the collector current flow of transistor 18. For a small input signal this voltage drop is relatively small so that the voltage applied to the base-to-emitter circuit of gain control transistor 28 is relatively large. Therefore, for small input signals the current flow through diode 30 which is in the emitter circuit of transistor 28 is large enough so that diode 30 is operating in the region beyond its reverse breakdown point. In response to the relatively large current flow through the emitter-to-base circuit of transistor 28, the current through collector 31 that is connected to series resistors 11 and 10 is correspondingly large and therefore develops across resistor 10 a voltage drop that is almost a maximum value. This voltage biases base 4 of type PNP transistor 5 sufficiently negative with respect to emitter 6 that approximately maximum gain is obtained. Similar circuits having resistors corresponding to resistors 10 and 11 are provided for the first, third, and fourth I.-F. amplifier stages so that the gains of these stages are also near maximum when the input signal is at a low level.

As the voltage of the input signal increases but remains below a predetermined threshold, the current in collector circuit 19 of detector transistor 18 increases and causes a moderate decrease in the base-to-emitter current of gain-control transistor 28. The decrease in emitter current causes a decrease in collector current of transistor 28 which flows through resistor 10. This decrease in current flow through resistor 10 decreases the bias on the emitter of transistor 5 to decrease the gain of the second I.-F. amplifier stage and similarly to decrease the gain in the remaining controlled I.-F. amplifier stages.

As the level of the input signal exceeds the threshold voltage of approximately 8 microvolts, the current flow through diode 30 is decreased until the diode suddenly breaks down and operates on that portion of its curve during which the diode offers maximum resistance and, therefore, conducts much less current. However, the current flow through diode 30 is still sufficient to provide required current through emitter 29 so that transistor 28 continues to function in response to variations of voltage applied to base 27 by operation of detector 18. When the level of the input signal is decreased from a relatively high level to a level below the predetermined threshold, diode 30 again breaks down and is thereby effective in providing sufficient current through the emitter and collector circuits of gain control transistor 28 for increasing the current flow through resistor 10 to that value which is required for obtaining maximum or near maximum gain from transistor 5 and from similar transistors in other stages of amplification.

The effectiveness of this gain control circuit may be observed from the following table in which the first column shows the level of signal in microvolts that is applied to input 1. The second column lists the output in decibels across resistor 24 with the reference being the output which is obtained for an input of 5 microvolts. The third column shows the resistance of the collector circuit of transistor 28, and the final column shows the reduction in gain obtained between the input 1 and the output across resistor 24, the reference being the output which is obtained from an input of 5 microvolts.

| Input, (μv.) | Output, db | Collector 31 Resistance (Ohms) | Gain Reduction, db |
|---|---|---|---|
| 5 | 0 (Ref.) | 1,500 | 0 |
| 8 | 0 | 5,800 | −4 |
| 200 | 0 | 8,500 | −32 |
| 1,000 | 0 | 20,000 | −46 |
| 20,000 | 0 | 38,000 | −72 |
| 200,000 | +0.5 | 50,000 | −91.5 |

In practice the circuit described herein has proved to provide especially flat response over a wide range of input signals. Since the threshold is largely determined by the characteristic of diode 30, the gain of the entire amplifier system is extremely stable in spite of temperature changes that usually change the gain of transistor amplifiers and also regardless of differences in transistor characteristics. Although the gain circuit of this invention has been shown for one particular embodiment, the gain control circuit may be changed by those skilled in the art for different applications and still be within the spirit and the scope of the following claims.

What is claimed is:

1. In an amplifier having an input circuit, a biasing circuit for changing the gain of the amplifier, and an output circuit, an automatic-gain-control circuit having a breakdown junction diode and a transistor that has an emitter, a base, and a collector, said automatic-gain control circuit having a nonlinear circuit that includes said diode, said base, and said emitter, means for detecting the output of said amplifier and for applying the detected output across said nonlinear circuit, a source of voltage, said biasing circuit being connected to said collector and to said source of voltage, said nonlinear circuit responding to a change in the output of said amplifier for changing the current flow in said biasing circuit and thereby for changing the gain of said amplifier, said diode being connected for current flow in its reverse direction so that a small change in current flow through said diode within a predetermined narrow range causes a rapid change in conductivity thereof, said diode having relatively low conductivity in response to signal above a predetermined level being applied to the input of said amplifier, and said diode becoming rapidly more conductive in response to said signal falling below said predetermined level to provide required current flow through said biasing circuit for obtaining substantially maximum gain of said amplifier.

2. In an amplifier having a plurality of first transistors in cascaded amplifier stages, an automatic-gain-control circuit having a breakdown junction diode and a second transistor, each of said transistors having a base, an emitter, and a collector, a source of direct-current voltage, said automatic-gain-control circuit having a nonlinear control circuit, said nonlinear control circuit including a first resistor, the base and the emitter of said second transistor and said diode connected in series, means responsive to change in the output of said amplifier for changing the current flow in said nonlinear control circuit, a transistor biasing circuit including the collector of said second transistor and a second resistor connected between the base and emitter of each of said first transistors, said biasing circuit being connected across said source, said diode being connected for current flow in its reverse direction so that a small change in current flow through said diode within a predetermined narrow range causes a rapid change in conductivity thereof, said diode having relatively low conductivity in response to signal above a predetermined level being applied to the input of said amplifier, and said diode becoming rapidly more conductive in response to said signal falling below said predetermined level to provide increase current flow through said second resistors thereby to provide bias within that range required for obtaining maximum gain of said amplifier stages.

3. A transistor amplifier having an automatic-gain-control circuit with a breakdown junction diode that functions to maintain a flat gain characteristic between the input and the output of said amplifier, said amplifier having a plurality of cascaded amplifier stages, each stage having a first transistor that has an emitter, a base, and a collector, a transistor detector connected to the output of said amplifier, a source of direct-current voltage, a second transistor having an emitter, a base and a collector, a first resistor, said automatic-gain-control circuit having a nonlinear control circuit including said first resistor, the base and the emitter of said second tarnsistor and said diode connected successively in series across said source of voltage, the output of said detector being connected to apply voltage between said base of said second transistor and said source, each of said stages having a bias circuit for biasing its respective transistor, each of said bias circuits comprising second and third resistors connected in series, said biasing circuits being connected in parallel between said source of voltage and the collector of said second transistor, the emitter and the base of each of said first transistors being connected to a respective biasing circuit for applying voltage that is developed across said second resistor between the base and the emitter of the respective first transistor, said diode being connected for conducting in its reverse direction the emitter current of said second transistor, and the conductivity of said diode decreasing in response to an increase in signal that is applied to said input of said amplifier, the change in conductivity of said diode being comparatively rapid over a small range of signal change about a predetermined threshold level.

References Cited in the file of this patent

UNITED STATES PATENTS

| | | |
|---|---|---|
| 2,399,968 | Whitlock | May 7, 1946 |
| 2,693,572 | Chase | Nov. 2, 1954 |
| 2,773,945 | Theriault | Dec. 11, 1956 |
| 2,897,353 | Schweiss | July 28, 1959 |